(12) United States Patent
Lin et al.

(10) Patent No.: US 10,437,294 B2
(45) Date of Patent: Oct. 8, 2019

(54) HOLDING STRUCTURE AND MOUNTING STRUCTURE

(71) Applicants: LITE-ON ELECTRONICS (GUANGZHOU) LIMITED, Guangzhou (CN); Lite-On Technology Corporation, Taipei (TW)

(72) Inventors: Chung-Nan Lin, Taipei (TW); Liang-Cheng Chiu, Taipei (TW)

(73) Assignees: LITE-ON ELECTRONICS (GUANGZHOU) LIMITED, Guangzhou (CN); Lite-On Technology Corporation, Taipei (TW)

(*) Notice: Subject to any disclaimer, the term of this patent is extended or adjusted under 35 U.S.C. 154(b) by 0 days.

(21) Appl. No.: 15/869,089

(22) Filed: Jan. 12, 2018

(65) Prior Publication Data

US 2018/0232018 A1     Aug. 16, 2018

Related U.S. Application Data

(60) Provisional application No. 62/459,608, filed on Feb. 16, 2017.

(51) Int. Cl.
| | |
|---|---|
| G06F 1/16 | (2006.01) |
| H05K 5/00 | (2006.01) |
| H05K 7/00 | (2006.01) |
| G06F 1/18 | (2006.01) |
| H05K 5/02 | (2006.01) |
| F16B 5/06 | (2006.01) |
| F16B 5/00 | (2006.01) |

(52) U.S. Cl.
CPC ........... G06F 1/181 (2013.01); H05K 5/0013 (2013.01); H05K 5/0221 (2013.01); F16B 5/0016 (2013.01); F16B 5/0614 (2013.01); F16B 2005/0678 (2013.01)

(58) Field of Classification Search
CPC ................................................. G06F 1/18–189
USPC ....................................... 361/679.31–679.39
See application file for complete search history.

(56) References Cited

U.S. PATENT DOCUMENTS

| | | | | |
|---|---|---|---|---|
| 7,701,706 B2 * | 4/2010 | Peng | ..................... | G11B 33/124 248/633 |
| 8,310,827 B2 * | 11/2012 | Huang | ..................... | G06F 1/187 312/223.2 |
| 8,749,966 B1 * | 6/2014 | Boudreau | ............... | G06F 1/187 361/679.33 |

(Continued)

Primary Examiner — Anthony M Haughton
(74) Attorney, Agent, or Firm — JCIPRNET

(57) ABSTRACT

A holding structure adapted to position a storage device is provided. The holding structure includes an integrally formed metal bracket. The integrally formed metal bracket includes a plurality of first segments and a second segment. The first segments are sequentially connected to each other and define an accommodating space, wherein any two adjacent first segments are bent relatively to each other, and the storage device is adapted to be positioned in the accommodating space. A first end of the second segment is connected to one of the first segments, and a second end of the second segment is detachably assembled to another one of the first segments to confine the storage device in the accommodating space. Moreover, a mounting structure including the holding structure is also mentioned.

16 Claims, 7 Drawing Sheets

(56) References Cited

U.S. PATENT DOCUMENTS

| | | | | |
|---|---|---|---|---|
| 8,755,178 | B2* | 6/2014 | Zheng | G11B 33/124 |
| | | | | 292/80 |
| 8,817,460 | B2* | 8/2014 | Yu | G06F 1/187 |
| | | | | 312/223.1 |
| 9,172,153 | B2* | 10/2015 | Tsai | G11B 33/124 |
| 9,274,571 | B2* | 3/2016 | Albert | G06F 1/187 |
| 9,392,719 | B1* | 7/2016 | Chen | G11B 33/124 |
| 2008/0089021 | A1* | 4/2008 | Deng | G06F 1/187 |
| | | | | 361/679.39 |
| 2008/0259554 | A1* | 10/2008 | Qin | G06F 1/187 |
| | | | | 361/679.34 |
| 2008/0278856 | A1* | 11/2008 | Peng | G11B 33/124 |
| | | | | 360/244.3 |
| 2009/0141457 | A1* | 6/2009 | Fujikawa | G06F 1/187 |
| | | | | 361/727 |
| 2015/0316964 | A1* | 11/2015 | Albert | G06F 1/187 |
| | | | | 361/679.36 |

* cited by examiner

HOLDING STRUCTURE AND MOUNTING STRUCTURE

CROSS-REFERENCE TO RELATED APPLICATION

This application claims the priority benefit of U.S. provisional application Ser. No. 62/459,608, filed on Feb. 16, 2017. The entirety of the above-mentioned patent application is hereby incorporated by reference herein and made a part of this specification.

BACKGROUND OF THE INVENTION

Field of the Invention

The disclosure relates to a holding structure and a mounting structure, and in particular, to a holding structure and a mounting structure configured to position and mount a storage device.

Description of Related Art

As technology advances, personal computers have been widely applied in work and life. Common personal computers currently include desktop computers and notebook computers.

In a personal computer, various data are stored in a hard disk drive, and the hard disk drive is generally mounted on a hard drive rack in a host of the personal computer. Currently, the hard drive rack is formed by assembling a plurality of parts, and it is required to individually manufacture and assemble the parts, which costs more material and assembly costs.

SUMMARY OF THE INVENTION

The embodiments of the invention provide a holding structure and a mounting structure that save material and assembly costs.

A holding structure according to an embodiment of the invention is adapted to position an electronic component. The holding structure includes an integrally formed metal bracket. The integrally formed metal bracket includes a plurality of first segments and a second segment. The first segments are sequentially connected to each other and define an accommodating space, wherein any two adjacent first segments are bent relatively to each other, and the electronic component is adapted to be positioned in the accommodating space. A first end of the second segment is connected to one of the first segments, and a second end of the second segment is detachably assembled to another one of the first segments to confine the electronic component in the accommodating space.

A mounting structure according to an embodiment of the invention is adapted for mounting an electronic component of an electronic device. The mounting structure includes a rack and a holding structure. The rack is adapted to be configured in the electronic device. The holding structure is adapted to position the electronic component. The holding structure includes an integrally formed metal bracket. The integrally formed metal bracket is positioned in the rack and includes a plurality of first segments and a second segment. The first segments are sequentially connected to each other and define an accommodating space, wherein any two adjacent first segments are bent relatively to each other, and the electronic component is adapted to be positioned in the accommodating space. A first end of the second segment is connected to one of the first segments, and a second end of the second segment is detachably assembled to another one of the first segments to confine the electronic component in the accommodating space.

In an embodiment of the invention, the integrally formed metal bracket is a one-piece non-assembly type component, at least one of the first segments includes an elastic bending portion, the first segments include three first segments, two of the first segments face each other, and the other one of the first segments and the second segment face each other.

In an embodiment of the invention, the second segment includes a clamp hook at the second end, the corresponding first segment has a slot, the clamp hook is adapted to pass through the slot, the second segment is adapted to be elastically deformed towards the accommodating space to separate the clamp hook from the slot, the integrally formed metal bracket includes a plurality of positioning portions on the first segments, and the positioning portions are adapted for positioning the electronic component.

In an embodiment of the invention, the integrally formed metal bracket includes at least one elastic piece on the first segments and is adapted to be positioned in the rack through the elastic piece, the rack has at least one positioning opening, the elastic piece includes a first protrusion and is adapted to be positioned in the positioning opening through the first protrusion, the elastic piece includes a free end, the free end is adapted to be applied with a force to separate the elastic piece from the rack, the rack has at least one slide groove, and the integrally formed metal bracket includes at least one second protrusion on the first segments and is adapted to be slidably disposed in the slide groove through the second protrusion.

In an embodiment of the invention, the second segment includes a clamp hook at the second end, the corresponding first segment includes a slot, the clamp hook is adapted to pass through the slot, the integrally formed metal bracket includes at least one elastic piece on the first segments and is adapted to be positioned in the rack through the elastic piece, the slot has a first portion and a second portion, the elastic piece corresponds to the first portion, and the clamp hook is positioned in the second portion.

In an embodiment of the invention, the second segment includes a clamp hook at the second end, the corresponding first segment has a slot, the clamp hook is adapted to pass through the slot, the integrally formed metal bracket includes at least one elastic piece on the first segments and is adapted to be positioned in the rack through the elastic piece, the slot has a first portion and a second portion, the elastic piece corresponds to the first portion, the clamp hook is positioned in the second portion, one end of the corresponding first segment close to the second segment is in a bent shape and corresponds to the second end, and the second portion is located at the portion in the bent shape of the corresponding first segment and is close to the second segment and corresponds to the second end.

Accordingly, in the embodiments of the invention, the integrally formed metal bracket is used to position the electronic component. The integrally formed metal bracket is not formed by assembling a plurality of parts. Therefore, it is not necessary to individually manufacture and assemble a plurality of parts, and it is possible to manufacture the integrally formed metal bracket by, for example, performing a stamping process in one single step, which thereby saves material and assembly costs of the holding structure.

To provide a further understanding of the aforementioned and other features and advantages of the disclosure, exemplary embodiments, together with the reference drawings, are described in detail below.

DESCRIPTION OF THE EMBODIMENTS

Figure 1:
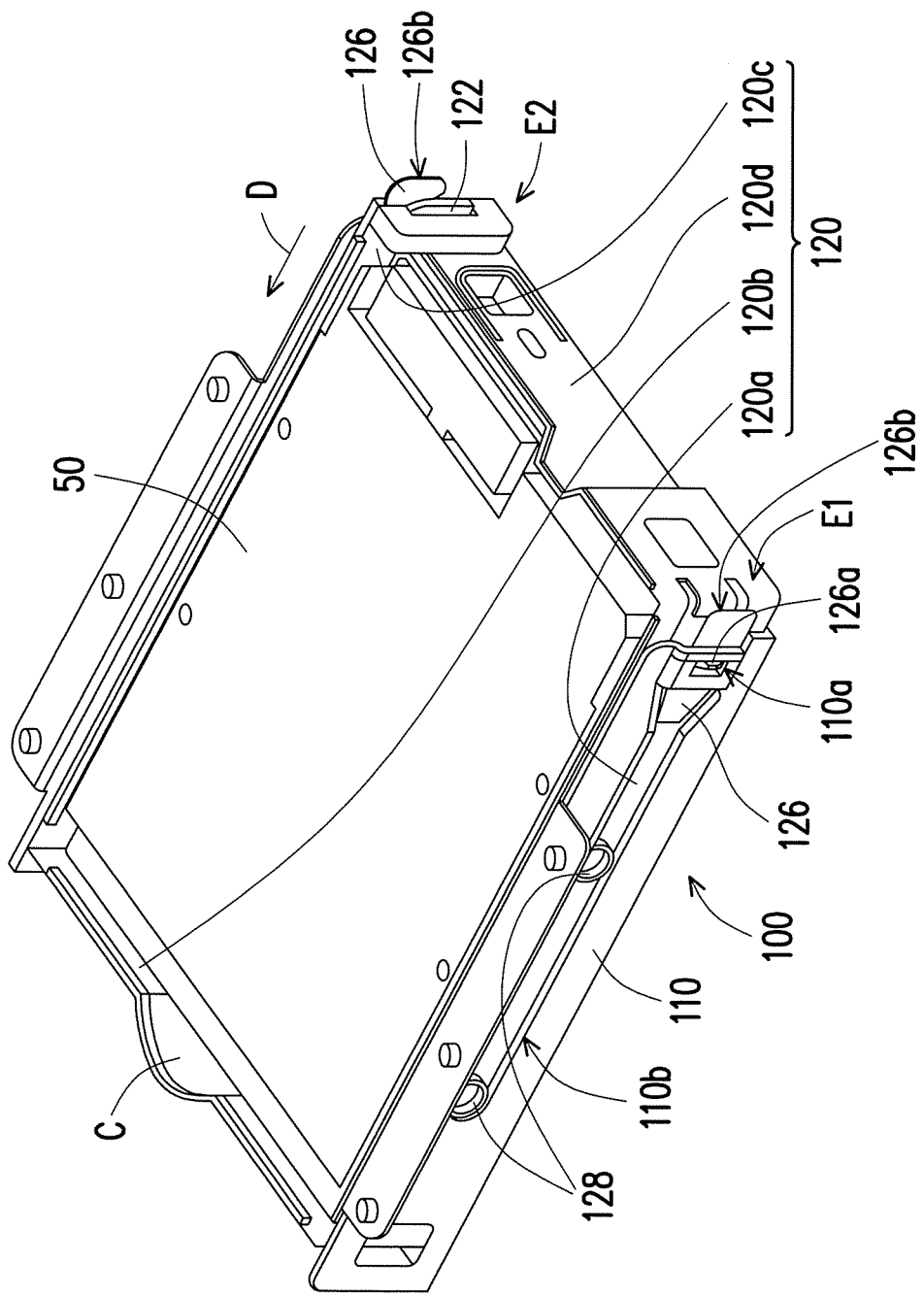
FIG. 1 is a perspective view illustrating a mounting structure and an electronic component according to an embodiment of the invention.
Figure 2:
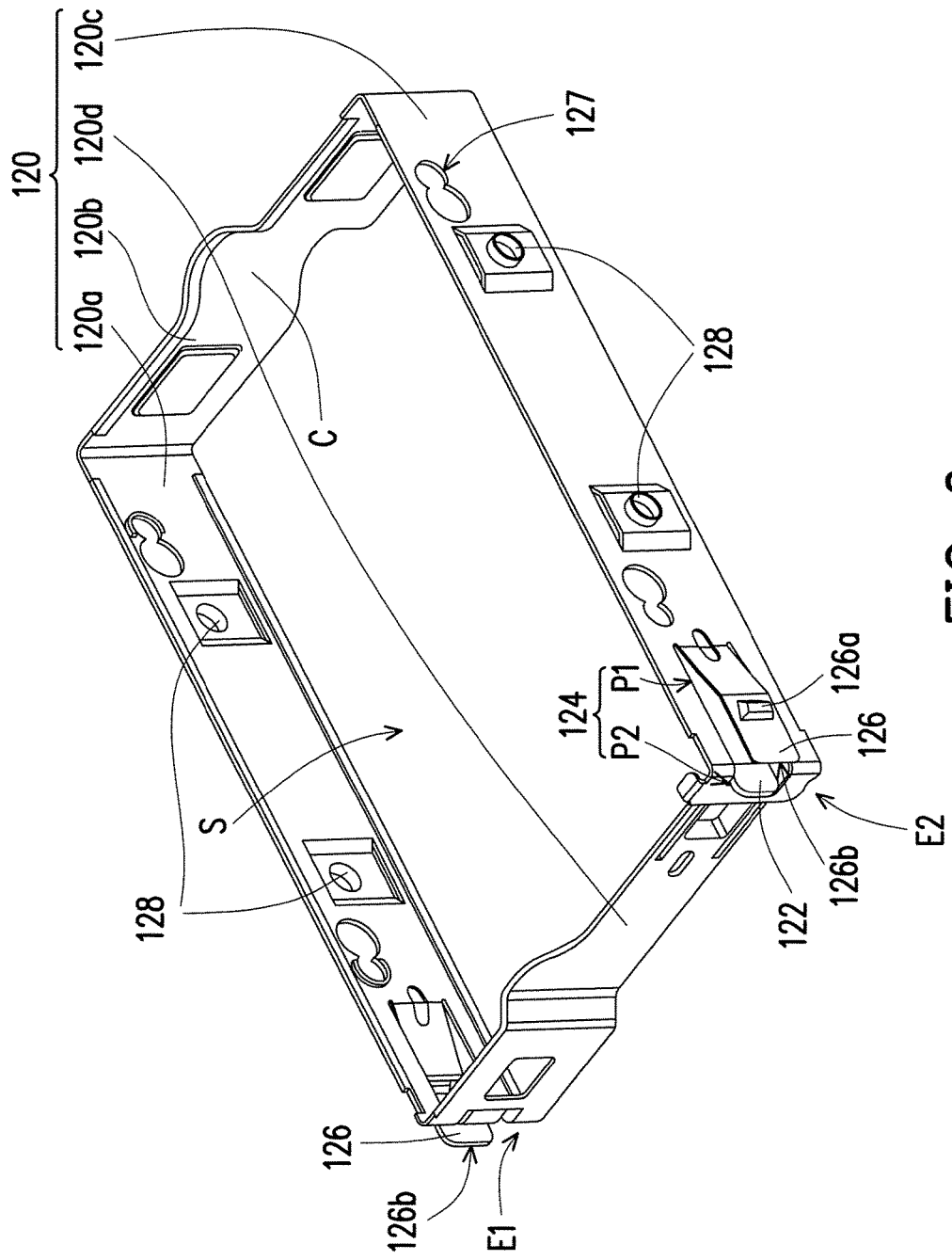
FIG. 2 is a perspective view illustrating a holding structure of FIG. 1.

FIG. 1 is a perspective view illustrating a mounting structure and an electronic component according to an embodiment of the invention. FIG. 2 is a perspective view illustrating a holding structure of FIG. 1. Referring to FIG. 1 and FIG. 2, a mounting structure 100 of the present embodiment is adapted for mounting an electronic component 50 of an electronic device. The electronic device is, for example, a personal computer, and the electronic component 50 is, for example, a storage device such as a hard disk drive. In other embodiments, the mounting structure 100 is configured for mounting electronic components of other types.

The mounting structure 100 includes a rack 110 and a holding structure 120. The rack 110 is adapted to be configured in a case of the electronic device. The holding structure 120 is, for example, an integrally formed metal bracket. The integrally formed metal bracket is positioned in the rack 110 and includes a plurality of first segments 120a to 120c and a second segment 120d. The first segments 120a to 120c and the second segment 120d are integrally connected to each other in a manner that does not involve pivotal connection. The first segment 120a and the first segment 120c face each other, and the first segment 120b and the second segment 120d face each other. The first segments 120a to 120c are sequentially connected to each other and define an accommodating space S, and the electronic component 50 is adapted to be positioned in the accommodating space S. A first end E1 of the second segment 120d is connected to the first segment 120a, and a second end E2 of the second segment 120d is detachably assembled to the first segment 120c to confine the electronic component 50 in the accommodating space S.

The integrally formed metal bracket is not formed by assembling a plurality of parts, but is a one-piece non-assembly type component. Therefore, it is not necessary to individually manufacture and assemble a plurality of parts, and it is possible to manufacture a strip-shaped metal base material into the integrally formed metal bracket by, for example, performing a stamping process in one single step, which thereby saves material and assembly costs of the holding structure 120. Moreover, since the integrally formed metal bracket is formed of metal, e.g., an iron piece, a function of shielding electromagnetic interference (EMI) is provided, and it is thus not necessary to additionally dispose a metal component for shielding electromagnetic interference.

Specifically, the two adjacent first segments 120a, 120b are bent relatively to each other through, for example, a stamping process in a manner that does not involve pivotal connection, the two adjacent first segments 120b, 120c are bent relatively to each other through, for example, a stamping process in a manner that does not involve pivotal connection, and the first end E1 of the second segment 120d and the first segment 120a are bent relatively to each other through, for example, a stamping process.

Figure 3A:
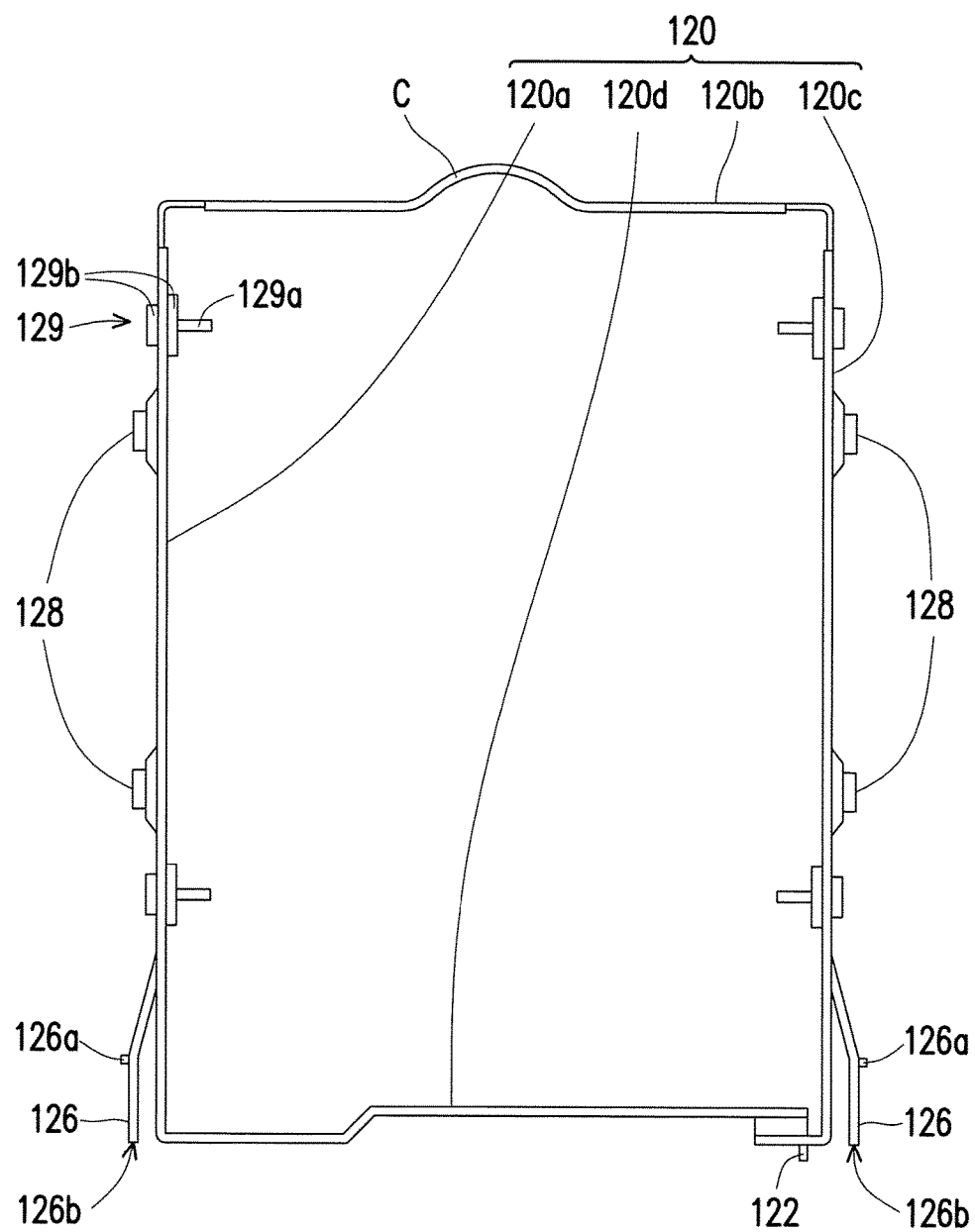
FIG. 3A is a top view illustrating the holding structure of FIG. 2.
Figure 3B:
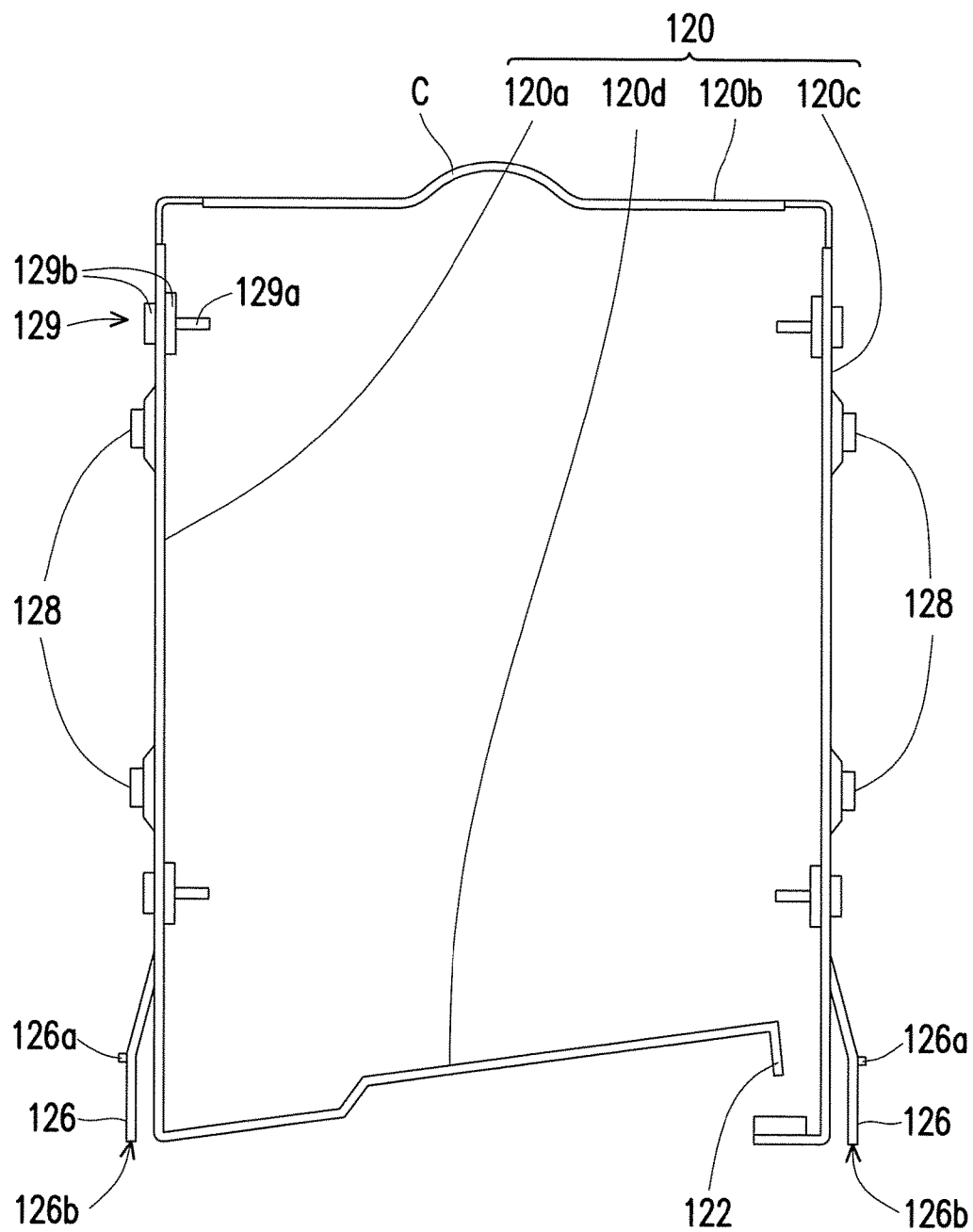
FIG. 3B illustrates elastic deformation of a second segment of FIG. 3A.

FIG. 3A is a top view illustrating the holding structure of FIG. 2. FIG. 3B illustrates elastic deformation of the second segment of FIG. 3A. When a user is to disassemble the electronic component 50 from the holding structure 120, the user may apply a force to the second segment 120d, such that the second segment 120d is elastically deformed from a state shown in FIG. 3A to a state shown in FIG. 3B to separate the second end E2 of the second segment 120d from the first segment 120c. At this time, the first segment 120c is not limited by the second end E2 of the second segment 120d anymore, and the integrally formed metal bracket can thus be adequately elastically deformed to separate the first segments 120a, 120c outwards from the electronic component 50 to remove their positioning of the electronic component 50. Moreover, the first segment 120b of the present embodiment includes an elastic bending portion C, which contributes to the elastic deformation of the integrally formed metal bracket.

Figure 4:
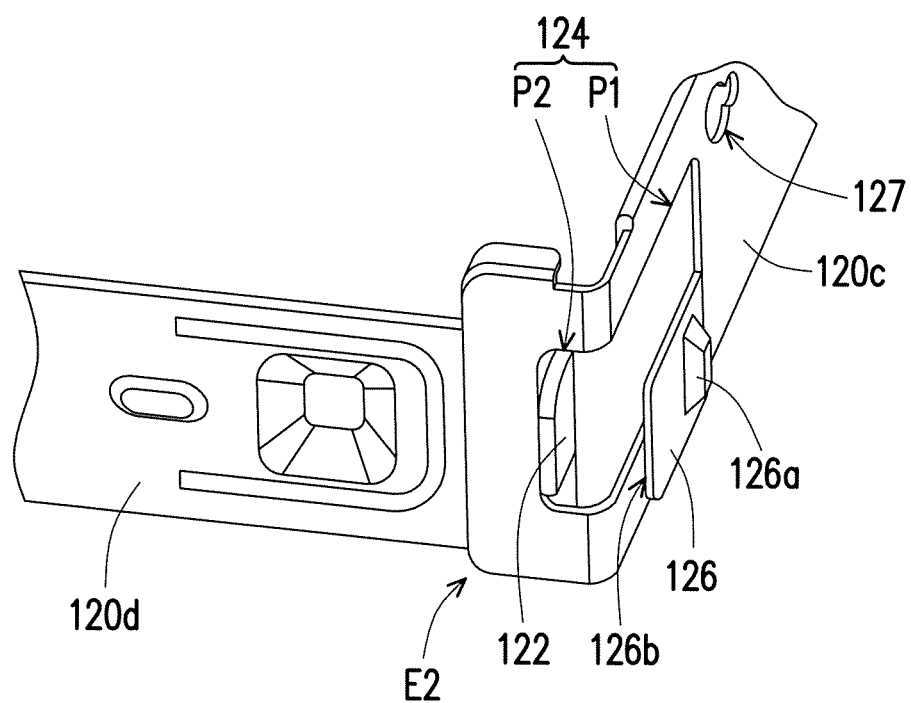
FIG. 4 is a partially enlarged diagram illustrating the holding structure of FIG. 2.

FIG. 4 is a partially enlarged diagram illustrating the holding structure of FIG. 2. As shown in FIG. 4, the second segment 120d of the present embodiment includes a clamp hook 122 at the second end E2, and the first segment 120c has a slot 124. The clamp hook 122 is adapted to pass through the slot 124 to allow the second end E2 of the second segment 120d to be detachably assembled to the first segment 120c.

In the present embodiment, a gap is present between the electronic component 50 and the second segment 120d to prevent assembly failure due to a tolerance of the electronic component 50. Moreover, the gap allows the second segment 120d to be elastically deformed towards the accommodating space S to separate the clamp hook 122 from the slot 124. Since the second segment 120d and its clamp hook 122 are elastically deformed inwards as described above and are not elastically deformed outwards, an operation space is saved, which contributes to miniaturization of the device. In addition, since the second segment 120d and its clamp hook 122 are elastically deformed inwards as described above and are not elastically deformed outwards, the second segment 120d and its clamp hook 122 are prevented from moving outwards unexpectedly and causing the electronic component 50 to potentially fall off. In other embodiments, the second end E2 of the second segment 120d is detachably assembled to the first segment 120c through other adequate structures, and the invention is not limited hereto.

In the present embodiment, the integrally formed metal bracket includes elastic pieces 126 respectively on the first segment 120a and the first segment 120c and is adapted to be positioned in the rack 110 through the elastic pieces 126. Specifically, the rack 110 has a positioning opening 110a as shown in FIG. 1, and the elastic piece 126 is bent outwards and includes a first protrusion 126a and is adapted to be positioned in the positioning opening 110a through the first protrusion 126a. The first protrusion 126a is close to a free end 126b of the elastic piece 126, and the free end of the elastic piece 126 is adapted to be applied with a pressing force to separate the elastic piece 126 from the rack 110. In a process of mounting the holding structure 120 along with the electronic component 50 therein to the rack 110, the holding structure 120 is moved into the rack 110 in a direction D as shown in FIG. 1, for example, and when the first protrusion 126a of the elastic piece 126 is moved to the positioning opening 110a, the first protrusion 126a is positioned in the positioning opening 110a by elasticity of the elastic piece 126.

Furthermore, the first segment 120c of the present embodiment has the slot 124, and an end of the first segment 120c close to the second segment 120d is in a bent shape and corresponds to the second end E2 of the second segment 120d. The slot 124 has a first portion P1 and a second portion P2. The second portion P2 is located at the portion in the bent shape of the first segment 120c and is close to the second segment 120d and corresponds to the second end E2 of the second segment 120d. The elastic piece 126 of the first segment 120c corresponds to the first portion P1 of the slot 124 on the first segment 120c, and the second segment 120d is positioned in the second portion P2 of the slot 124 through its clamp hook 122 as described above. In other words, the elastic piece 126 and the clamp hook 122 share the same slot 124. Through such design, in a process of manufacturing the integrally formed metal bracket, the one slot formed when stamping the elastic piece 126 is the slot 124 shown in FIG. 2 and FIG. 4, which simplifies the manufacturing process.

Moreover, the rack 110 of the present embodiment has a slide groove 110b as shown in FIG. 1. The integrally formed metal bracket includes a second protrusion 128 on the first segments 120a, 120c and is adapted to be slidably disposed in the slide groove 110b through the second protrusion 128. Accordingly, in a process of moving the holding structure 120 into or out of the rack 110, the holding structure 120 is steadily moved along the slide groove 110b, and the holding structure 120 is securely mounted in the rack 110 through coordination between the second protrusion 128 and the slide groove 110b.

In the present embodiment, the integrally formed metal bracket includes a plurality of positioning portions 129 (illustrated in FIG. 3A and FIG. 3B) on the first segments 120a, 120c, and the positioning portions 129 are adapted to position the electronic component 50 through their positioning columns 129a. In addition, each of the positioning portions 129 includes, for example, an elastic buffer material 129b and is mounted in a grommet 127 on the first segments 120a, 120c. The elastic buffer material 129b is, for example, rubber and is configured to provide buffering effect for the electronic component 50. The invention does not limit the form of the positioning portion, which is illustrated in an example below.

Figure 5:
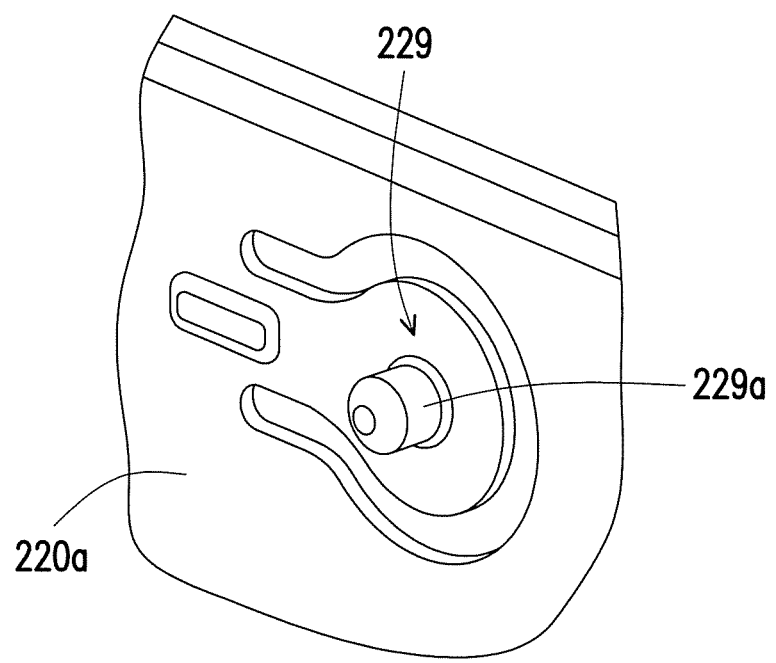
FIG. 5 is a partial perspective view illustrating a holding structure according to another embodiment of the invention.

FIG. 5 is a partial perspective view illustrating a holding structure according to another embodiment of the invention. Configuration and function of a first segment 220a of FIG. 5 are similar to the configuration and function of the first segment 120a or the first segment 120b of the previous embodiment and are thus not repeatedly described here. A difference between the embodiment shown in FIG. 5 and the previous embodiment lies in that a positioning portion 229 on the first segment 220a and its positioning column 229a are integrally connected to the first segment 220a to further save material and assembly costs of the holding structure.

Figure 6:
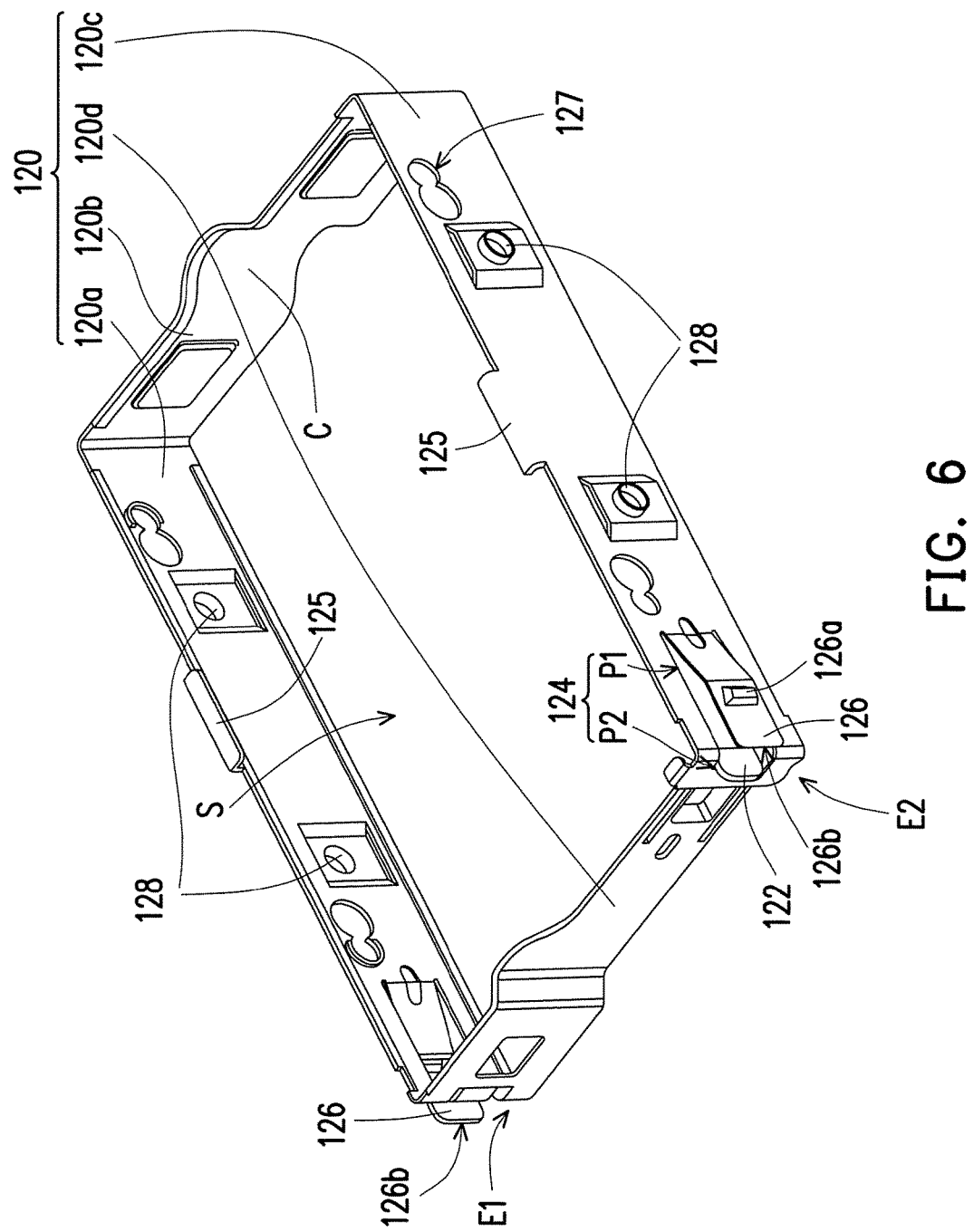
FIG. 6 is a perspective view illustrating a holding structure according to an embodiment of the invention.

FIG. 6 is a perspective view illustrating a holding structure according to an embodiment of the invention. The difference between the embodiment of FIG. 6 and the embodiment of FIG. 2 is that, the holding structure 120 has two supporting structures 125 respectively connected to the first segments 120a and 120c for supporting the storage device.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A holding structure adapted to position a storage device, the holding structure comprising:
an integrally formed metal bracket comprising:
a plurality of first segments being formed in a single piece and defining an accommodating space, wherein any two adjacent ones of the first segments are bendably connected to each other; and
a second segment, a first end of the second segment being bendably connected to one of the first segments, and a second end of the second segment being detachably assembled to another one of the first segments to confine the storage device in the accommodating space,
wherein the second segment comprises a main body and a clamp hook formed at the second end, the corresponding first segment has a slot adapted to engage with the clamp hook, the main body bendably connected to the corresponding first segment at the first end is adapted to be elastically deformed towards the accommodating space to separate the clamp hook from the slot.

2. The holding structure according to claim 1, wherein the integrally formed metal bracket is a one-piece non-assembly type component, at least one of the first segments comprises an elastic bending portion, a number of the first segments is three, two of the first segments face each other, and the other one of the first segments and the second segment face each other.

3. The holding structure according to claim 1, wherein the integrally formed metal bracket comprises a plurality of positioning portions on the first segments, and the positioning portions are adapted for positioning the storage device.

4. The holding structure according to claim 1, wherein the integrally formed metal bracket comprises at least one elastic piece on the first segments and is adapted to be positioned in a rack through the elastic piece, the rack has at least one positioning opening, the elastic piece comprises a first protrusion and is adapted to be positioned in the positioning opening through the first protrusion, the elastic piece comprises a free end, and the free end is adapted to be applied with a force to separate the elastic piece from the rack.

5. The holding structure according to claim 1, wherein a rack has at least one slide groove, and the integrally formed metal bracket comprises at least one second protrusion on the first segments and is adapted to be slidably disposed in the slide groove through the second protrusion.

6. The holding structure according to claim 1, wherein the second segment comprises a clamp hook at the second end, the corresponding first segment has a slot, the clamp hook is adapted to pass through the slot, the integrally formed metal bracket comprises at least one elastic piece on the first segments and is adapted to be positioned in a rack through the elastic piece, the slot has a first portion and a second portion, the elastic piece corresponds to the first portion, and the clamp hook is positioned in the second portion.

7. The holding structure according to claim 2, wherein the elastic bending portion is formed on the first segment opposite to the second segment and protrudes outward from the accommodating space.

8. The holding structure according to claim 6, wherein the first portion and the second portion are connected with each other, and an extending direction of the first portion is not parallel to an extending direction of the second portion.

9. A mounting structure adapted for mounting a storage device of an electronic device, the mounting structure comprising:
a rack adapted to be configured in the electronic device; and
a holding structure comprising an integrally formed metal bracket, wherein the integrally formed metal bracket is positioned in the rack and comprises:
a plurality of first segments integrally and flexibly connected to each other and defining an accommodating space, wherein any two adjacent ones of the first segments are bent relatively to each other, and the storage device is adapted to be positioned in the accommodating space; and
a second segment comprising a main body and a clamp hook, the main body being integrally and bendably connected to one of the first segments at a first end of the second segment, and the clamp hook being detachably assembled to another one of the first segments at a second end of the second segment to confine the storage device in the accommodating space,
wherein the clamp hook is adapted to pass through a slot of the corresponding first segment, and the main body is adapted to be elastically deformed towards the accommodating space to separate the clamp hook from the slot.

10. The mounting structure according to claim 9, wherein the integrally formed metal bracket is a one-piece non-assembly type component, at least one of the first segments comprises an elastic bending portion, a number of the first segments is three, two of the first segments face each other, and the other one of the first segments and the second segment face each other.

11. The mounting structure according to claim 9, wherein the integrally formed metal bracket comprises a plurality of positioning portions on the first segments, and the positioning portions are adapted for positioning the storage device.

12. The mounting structure according to claim 9, wherein the integrally formed metal bracket comprises at least one elastic piece on the first segments and is adapted to be positioned in the rack through the elastic piece, the rack has at least one positioning opening, the elastic piece comprises a first protrusion and is adapted to be positioned in the positioning opening through the first protrusion, the elastic piece comprises a free end, the free end is adapted to be applied with a force to separate the elastic piece from the rack, the rack has at least one slide groove, and the integrally formed metal bracket comprises at least one second protrusion on the first segments and is adapted to be slidably disposed in the slide groove through the second protrusion.

13. The mounting structure according to claim 9, wherein the rack has at least one slide groove, and the integrally formed metal bracket comprises at least one second protrusion on the first segments and is adapted to be slidably disposed in the slide groove through the second protrusion.

14. The mounting structure according to claim 9, wherein the second segment comprises a clamp hook at the second end, the corresponding first segment comprises a slot, the clamp hook is adapted to pass through the slot, the integrally formed metal bracket comprises at least one elastic piece on the first segments and is adapted to be positioned in the rack through the elastic piece, the slot has a first portion and a second portion, the elastic piece corresponds to the first portion, the clamp hook is positioned in the second portion, one end of the corresponding first segment close to the second segment is in a bent shape and corresponds to the second end, and the second portion is located at the portion in the bent shape of the corresponding first segment and is close to the second segment and corresponds to the second end.

15. The mounting structure according to claim 10, wherein the elastic bending portion is formed on the first segment opposite to the second segment and protrudes outward from the accommodating space.

16. The mounting structure according to claim 14, wherein the first portion and the second portion are connected with each other, and an extending direction of the first portion is not parallel to an extending direction of the second portion.

* * * * *